United States Patent [19]
Sohnle

[11] 4,059,778
[45] Nov. 22, 1977

[54] RECTIFIER ASSEMBLY STRUCTURE, PARTICULARLY FOR AUTOMOTIVE-TYPE ALTERNATOR-RECTIFIER COMBINATION

[75] Inventor: Rüdiger Sohnle, Stuttgart, Germany

[73] Assignee: Robert Bosch G.m.b.H., Stuttgart, Germany

[21] Appl. No.: 762,772

[22] Filed: Jan. 25, 1977

[30] Foreign Application Priority Data

Jan. 31, 1976   Germany .............................. 2603786

[51] Int. Cl.² ........................................... H02K 11/00
[52] U.S. Cl. .................................... 310/68 D; 357/81; 363/145
[58] Field of Search ........................... 310/68 R, 68 D; 321/8 R, 8 C; 357/81; 361/381, 417

[56] References Cited

U.S. PATENT DOCUMENTS

| | | | |
|---|---|---|---|
| 2,942,165 | 6/1960 | Jackson et al. | 321/8 C |
| 3,078,409 | 2/1963 | Bertsche, Jr. et al. | 310/68 D |
| 3,253,167 | 5/1966 | Bates et al. | 310/68 R |
| 3,320,498 | 5/1967 | Evans | 357/81 |
| 3,866,072 | 2/1975 | Nagai | 310/68 D |
| 3,970,881 | 7/1976 | Sato | 310/68 D |
| 3,979,659 | 9/1976 | Lynch, Jr. et al. | 310/68 D X |
| 4,007,402 | 2/1977 | Allport | 321/8 C X |

*Primary Examiner*—William M. Shoop
*Attorney, Agent, or Firm*—Flynn & Frishauf

[57] ABSTRACT

To simplify manufacture and assembly of automotive alternator-type rectifier combinations, the rectifier structure is made by pressing rectifier diodes, in groups of opposite polarity, into identical cooling plates which are constructed in essentially rectangular form with one corner taken out, the rectangular forms being crossed and located in parallel planes, stacked one above each other, so that the interconnecting links between the positive and negative diodes on the assemblies will have equal distance from each other, and the cooling plates will be identical.

15 Claims, 3 Drawing Figures

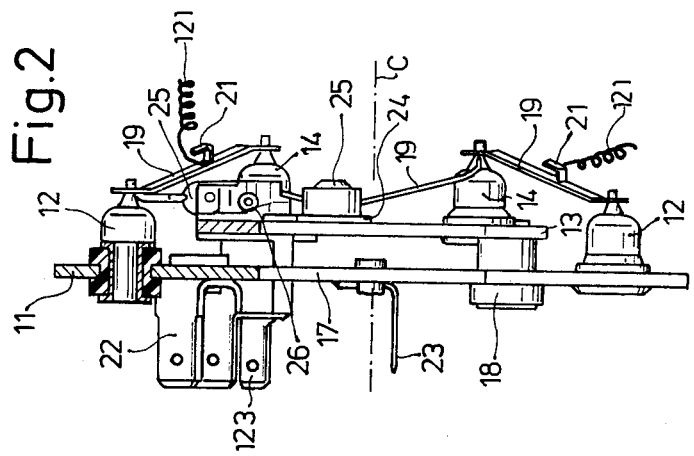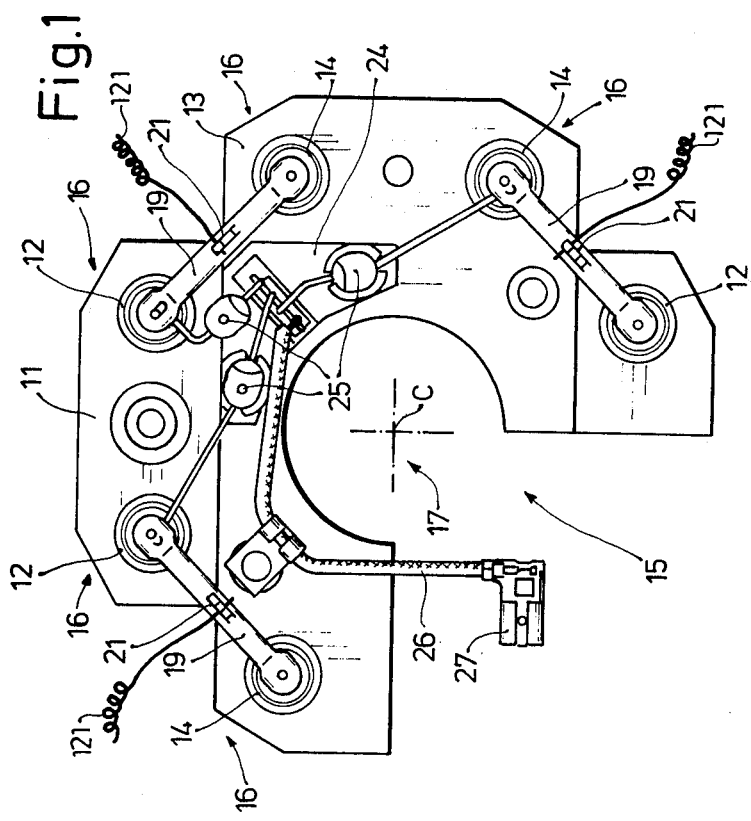

RECTIFIER ASSEMBLY STRUCTURE, PARTICULARLY FOR AUTOMOTIVE-TYPE ALTERNATOR-RECTIFIER COMBINATION

Cross reference to similar rectifier arrangements:
German DT-AS No. 1,613,040
German DT-AS No. 2,250,557
German DT-OS No. 1,916,237.

The present invention relates to a rectifier assembly structure, and more particularly to such a structure which is to be combined with an alternator for automotive use, for example by being assembled together with the alternator within a common housing, so that the output obtained from the alternator will be, when rectified, a d-c output.

Alternator-rectifier combinations for automotive use usually use three-phase alternators. The generated three-phase output voltage is rectified in a three- or six-phase rectifier, and the obtained direct current is used for the onboard network of the vehicle. The direct current is stored in a battery. The rectifier arrangement usually uses six power diodes. Three positive and three negative diodes are used which are connected to the alternator in a three-phase rectifier bridge circuit. Additional rectifier diodes may be used to provide d-c for the field. The power output diode rectifiers must dissipate heating losses and therefore require mounting in a heat sink, typically a cooling plate. Cooling plates of such structures, as previously proposed, are essentially semicircular with a central opening, located to fit around the shaft of the alternator and within the path of cooling air flow generated by a small fan likewise located on the alternator shaft. The diodes are pressed into the cooling plates. One cooling plate carries the positive diodes and is connected to the positive output terminal of the alternator-rectifier combination; a second cooling plate carries the negative diodes and is connected to the negative terminal or ground or chassis, that is, for example to the housing structure of the alternator, so that it forms a common ground or chassis connection with the vehicle. The alternating current terminals of the diodes are interconnected and further each to a phase terminal of a phase winding of the alternator. The arrangement of positive diodes and negative diodes on essentially semicircular cooling plates, while suitable for its purpose, has the disadvantage that the electrical connections to be made for the a-c terminals from the outputs of the phase windings have comparatively complicated geometrical shapes of different lengths. It is difficult to assemble both cooling plates forming the heat sinks for the diodes in a single compact unit which can readily be assembled within the generator housing and can additionally readily be removed or replaced for maintenance, repair or replacement if one of the diodes should prove to be defective.

It is an object of the present invention to provide a structure for the diode assembly which, while having the desirable electrical characteristics of efficient cooling, has the additional advantage of ease of assembly, disassembly, and the capability of being installed in combination with the alternator in a simple manner and without requiring a multiplicity of special connecting elements.

SUBJECT MATTER OF THE PRESENT INVENTION

Briefly, the heat sinks are formed as plates constructed, essentially, as elongated, rectangular plates, preferably with the corners cut off. Three diodes are located at three of the corners. The free corner can be cut out. The plates are crossed with respect to each other and located in staggered, axially (with respect to the generator) spaced planes.

By crossing the heat sink plates in this manner, the a-c terminal connections of the positive diodes to the negative diodes will have the same length and shape, permitting easy assembly with respect to each other, easy connection to the output phase terminals from the alternator, and inexpensive mass production manufacture.

The connecting elements between the diodes can all be identical and formed as punched sheet metal strips or rails. The thickness of the heat sink plates is preferably so dimensioned that the diodes can be press-fitted therein without any projecting burrs or beads being necessary in the plates to hold them securely in position. Both plates can then be made from the same stamping die, so that they are identical; in installation, one plate is merely inverted with respect to the other before mounting the diodes. This additionally simplifies manufacture. The positive diodes and the negative diodes will have a minimum of distance from each other, so that the connecting elements, preferably rails or strips, can be self-supporting and no additional printed circuit carrier using an insulating board is necessary. This further simplifies manufacture, permits omission of an element and particularly of an element which may cause trouble under the severe operating conditions to which automotive alternators are exposed, including mechanical and temperature shock conditions and vibration, which may lead to fracture of the insulating material. The a-c output connections from the phase windings of the alternator can be carried directly to the connecting rails or strips.

The invention will be described by way of example with reference to the accompanying drawings, wherein:

FIG. 1 is a top view of a rectifier assembly in accordance with the present invention;

FIG. 2 is a side view; and

Figure 3:
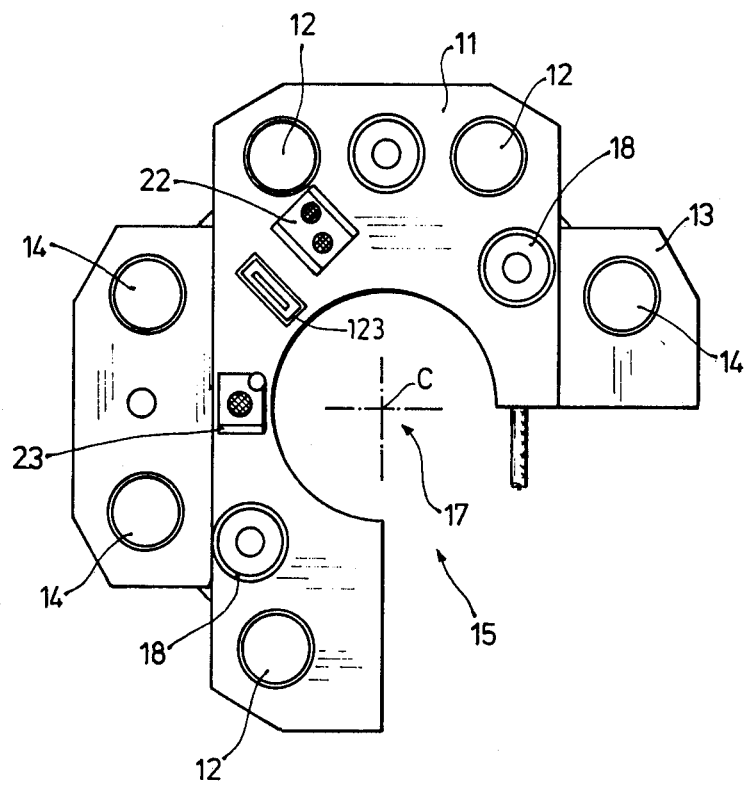
FIG. 3 is a rear view, similar to FIG. 1, but looked at from the other side of the assembly.

Two essentially rectangular heat sink cooling plates, with the corners removed, are provided. One plate 11 has positive diodes 12 press-fitted therein. The second plate 13 has negative diodes 14 press-fitted therein. The plates 11, 13 have essentially elongated rectangular shape, with one quarter or quadrant 15 having been omitted. Additionally, the corners are cut off, as shown at 16; they may also be rounded. The plates 11, 13 have a central circular cut-out 17 through which the shaft C of the alternator can fit. The plates 11, 13 are secured in position with respect to each other by spacers 18 (FIG. 2). The spacers and their attachments to the plates are electrically insulating, so that the plates are electrically insulated from each other. Plates 11, 13 are plane and flat and have such a thickness that the diodes 12, 14 can be press-fitted therein without requiring an additional guiding bead or guide sleeve. A suitable material for the plates 11, 13 is aluminum, copper, steel and a suitable thickness is 2 to 4 mm. Diodes 12, 14 are located at the outer corners of the three remaining quadrants of the rectangular plates 11, 13. When crossing the plates, as best seen in FIG. 1 and 3, the distances between the diodes at the three corners will be identical, so that the a-c terminal between positive and negative of an adjacent pair will be identical. The connection of the a-c terminals between a positive diode 12 and a negative diode 14 of an adjacent pair is effected by connecting strips or rails 19 which likewise can then be identical. The strips or rails 19 are formed with a punched-out tab 21, preferably centrally thereof, in which the phase terminals from the generator windings 121 can be inserted and mechanically and electrically connected to the rails — for example by soldering. In the example shown, the negative diodes 14 and the second heat sink cooling plate 13 are connected to ground or chassis; a separate terminal flag 23 is provided therefor. The first heat sink cooling plate 11 with positive diodes 12 has a terminal pin 22 secured thereto for connection to the d-c supply of the network with which the alternator is to be used, for example to the on-board network of an automotive vehicle, and hence to the battery thereof.

A further terminal connection 123 is provided, secured to the first heat sink plate 11 to which the positive diodes 12 are attached. Terminal 123 is provided to connect to the field winding of the alternator. The second cooling plate 13 with the negative diodes 14 has a holder or assembly plate 24 secured thereto on which exciter diodes 25 are attached. The cathodes of the exciter diodes 25 are all connected together and to a flexible wire 26 and hence to a connecting terminal 27 for connection to a voltage regulator (not shown) and secured, for example, to the housing structure (not shown) of the alternator with which the structure of FIG. 1 is intended to be combined.

Plates 11, 13, as best seen in FIG. 3, can have an outer shape which is identical, so that they can be made by a single stamping tool; the attachment holes for the connecting pins and plate 24 can also be provided on both plates, with holes which are not needed in one them being left empty. The plates are mounted, preferably, inverted with respect to each other so that the free quadrant will overlap to provide for easy access and to facilitate assembly into the alternator housing.

The plates can be incorporated in an alternator structure which is described and shown for example in U.S. patent application Ser. No. 712,835 filed Aug. 9, 1976, Binder the disclosure of which is hereby incorporated by reference.

I claim:

1. Rectifier assembly to rectify the output of a three-phase alternator comprising
   first and second heat sink cooling plates (11, 13);
   a first group (12) of positive rectifying diode rectifiers secured in electrical and thermal contact to the first plate (11);
   a second group (14) of negative rectifying diode rectifiers secured in electrical and thermal contact with the second plate (13);
   and connecting leads (19) interconnecting the diode groups and the alternator phase windings (121), wherein, in accordance with the invention,
   the first and second heat sink plates (11, 13) are flat, elongated, essentially rectangular plates located radially symmetrically, and axially staggered with respect to the shaft (C) of the alternator and positioned in crossed relation with respect to each other.

2. Assembly according to claim 1, wherein the plates (11, 13) are crossed at essentially 90° with respect to each other.

3. Assembly according to claim 1, wherein the plates (11, 13) are formed with a central, essentially circular cut-out (17) to pass the alternator shaft (C) therethrough.

4. Assembly according to claim 1, wherein the rectifier plates (11, 13) are shaped in rectangular form with one quadrant (15) removed.

5. Assembly according to claim 4, wherein the plates (11, 13) are located staggered above each other in such position that, in plan view, the remaining quadrants are positioned in staggered relation, and the imaginary removed quadrants of the respective plates are in axial alignment.

6. Assembly according to claim 4, wherein the diodes of the groups (12, 14) each comprise three diodes, the respective diodes on the respective plates being located adjacent the outer corners of the remaining three quadrants of the respective cooling plates.

7. Assembly according to claim 5, wherein the diodes of the groups (12, 14) each comprise three diodes, the respective diodes on the respective plates being located adjacent the outer corners of the remaining three quadrants of the respective cooling plates;
   and wherein the cooling plates are formed with an essentially circular cut-out (17) surrounding the alternator shaft (C).

8. Assembly according to claim 6, wherein the distances from the connecting terminals of the positive rectifying diodes (12) to the respective corresponding terminals of the negative rectifying diodes (14) are essentially equal.

9. Assembly according to claim 8, wherein the electrical connecting leads comprise self-supporting connecting rails or strips (19).

10. Assembly according to claim 9, wherein three connecting rails or strips (19) are provided which are essentially identical to each other.

11. Assembly according to claim 7, wherein the diodes of the groups are secured to the plates by an interference or press fit;
    and the plates are formed with openings to receive the diodes, said openings being formed to have essentially flush edges with respect to the surface of the respective plates, and being formed, essentially, without drawing beads or ridges.

12. Assembly according to claim 1, wherein the plates are essentially identical and are located inverted with respect to each other.

13. Assembly according to claim 7, wherein the plates are essentially identical, are crossed at angles of about 90° and are positioned inverted with respect to each other;
    and wherein the connecting leads interconnecting the diodes of the diode groups comprise essentially identical, self-supporting rails or strips (19), the diodes being secured to the respective plates by an interference or press fit in holes formed in the plates, the holes being formed essentially without projecting drawing beads or ridges.

14. Alternator structure in combination with a rectifier assembly
    wherein the rectifier assembly is secured to the alternator structure, the output leads of the alternator being connected to the connecting leads interconnecting the diode groups,
    and the rectifier assembly comprises the rectifier assembly of claim 1.

15. Alternator structure in combination with a rectifier assembly, wherein the rectifier assembly is secured to the alternator structure,
    the rectifier assembly comprises the assembly of claim 13,
    and the alternator phase windings (121) are connected to the connecting rails or strips (19).

* * * * *